US011488797B2

(12) United States Patent
Fujioka

(10) Patent No.: US 11,488,797 B2
(45) Date of Patent: Nov. 1, 2022

(54) ELECTROMAGNETIC RELAY DIAGNOSTIC DEVICE

(71) Applicant: Mitsubishi Electric Corporation, Tokyo (JP)

(72) Inventor: Katsuhiko Fujioka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 332 days.

(21) Appl. No.: 16/957,230

(22) PCT Filed: Feb. 13, 2018

(86) PCT No.: PCT/JP2018/004901
§ 371 (c)(1),
(2) Date: Jun. 23, 2020

(87) PCT Pub. No.: WO2019/159233
PCT Pub. Date: Aug. 22, 2019

(65) Prior Publication Data
US 2020/0411266 A1      Dec. 31, 2020

(51) Int. Cl.
*G01R 31/00* (2006.01)
*H01H 47/00* (2006.01)
(Continued)

(52) U.S. Cl.
CPC ......... *H01H 47/002* (2013.01); *G01R 15/181* (2013.01); *G01R 31/3278* (2013.01); *H01H 9/161* (2013.01); *H01H 50/08* (2013.01)

(58) Field of Classification Search
USPC .......................... 361/160; 324/418, 420–424
See application file for complete search history.

(56) References Cited

U.S. PATENT DOCUMENTS

| | | | |
|---|---|---|---|
| 2002/0085332 A1* | 7/2002 | Ide | H01H 47/005 361/152 |
| 2015/0028877 A1* | 1/2015 | McCormick | H01H 50/00 324/418 |

FOREIGN PATENT DOCUMENTS

| | | |
|---|---|---|
| JP | H06103872 A | 4/1994 |
| JP | H08205128 A | 8/1996 |
| JP | 2004220288 A | 8/2004 |

OTHER PUBLICATIONS

International Search Report (PCT/ISA/210) with translation and Written Opinion (PCT/ISA/237) dated Mar. 27, 2018, by the Japan Patent Office as the International Searching Authority for International Application No. PCT/JP2018/004901.

(Continued)

*Primary Examiner* — Vincent Q Nguyen
(74) *Attorney, Agent, or Firm* — Buchanan Ingersoll & Rooney PC

(57) ABSTRACT

An electromagnetic relay diagnostic device includes: an operation detection unit including a first light-emitting unit emitting light when a current flows through a wiring line connected to a coil of an electromagnetic relay; an operation detection unit including a second light-emitting unit emitting light when a current stops flowing through the wiring line; an operation detection unit including a third light-emitting unit emitting light when detecting a change in conductive state of a wiring line connected to a contact of the electromagnetic relay; an operation detection unit including a fourth light-emitting unit emitting light when detecting that the change in conductive state of the wiring line has disappeared; an imaging unit capturing a moving image of the operation detection units; and a diagnostic unit calculating a contact-on operation time and a contact-off operation time using the moving image, and diagnosing (Continued)

whether an abnormality has occurred in the electromagnetic relay.

15 Claims, 9 Drawing Sheets

(51) Int. Cl.
    *G01R 15/18*     (2006.01)
    *G01R 31/327*     (2006.01)
    *H01H 9/16*     (2006.01)
    *H01H 50/08*     (2006.01)

(56) References Cited

OTHER PUBLICATIONS

Notice of Reasons for Refusal dated Jun. 12, 2018, by the Japan Patent Office for Application No. 2018-524297.

* cited by examiner

ELECTROMAGNETIC RELAY DIAGNOSTIC DEVICE

FIELD

The present invention relates to an electromagnetic relay diagnostic device which measures an operation time of an electromagnetic relay to diagnose an abnormality.

BACKGROUND

In a control circuit for controlling a breaker and a disconnector of a gas insulated device, two or more electromagnetic relays are used, and the control is performed in combination of the two or more electromagnetic relays. If a failure or an operation delay occurs in any of the electromagnetic relays, there may be a case where the control circuit cannot perform a normal control operation, thereby leading to poor control of the gas insulated device.

Therefore, each device is operated at the time of periodic inspection, and if the device operation is within a control range, every electromagnetic relay of the control circuit is determined to be normal. However, since the electromagnetic relay itself is not inspected in this manner, malfunction may possibly occur immediately after the inspection.

Regarding a defect caused by a factor of aging degradation, such as an excessive tightness of a mechanism part of the electromagnetic relay, it is useful to diagnose the defect by measuring a contact-on operation time, which is a time from when an electric current starts flowing through a wiring line connected to a coil of the electromagnetic relay to when a conductive state of a wiring line connected to a contact of the electromagnetic relay changes, and a contact-off operation time, which is a time from when an electric current stops flowing through the wiring line connected to the coil of the electromagnetic relay to when the change in the conductive state of the wiring line connected to the contact of the electromagnetic relay disappears. However, since it takes time to attach a measuring instrument, it is necessary to provide a simple measuring device.

Patent Literature 1 discloses a device that captures an image of a relay with an operation indicator light in a relay control device by using a camera with high-speed shutter, and observes a control state of the control device on the basis of a lighting state of the relay with an operation indicator light.

CITATION LIST

Patent Literature

Patent Literature 1: Japanese Patent Application Laid-open No. H8-205128

SUMMARY

Technical Problem

The invention disclosed in Patent Literature 1 has only a function of recognizing whether the relay with an operation indicator light is in an operating state or a non-operating state, but has no means for detecting the degree of delay in operation. Therefore, the inventive technique disclosed in Patent Literature 1 has been unable to measure the contact-on operation time and contact-off operation time effective for diagnosing the presence or absence of a defect caused by aging degradation of an electromagnetic relay.

The present invention has been made in view of the above circumstances, and an object thereof is to provide an electromagnetic relay diagnostic device capable of measuring a contact-on operation time and a contact-off operation time.

Solution to Problem

In order to solve the above-described problem and achieve the object, the present invention provides an electromagnetic relay diagnostic device, comprising: a first operation detection unit including a first light-emitting unit to emit light when a current flows through a first wiring line connected to a coil of an electromagnetic relay; a second operation detection unit including a second light-emitting unit to emit light when a current stops flowing through the first wiring line; a third operation detection unit including a third light-emitting unit to emit light when detecting a change in conductive state of a second wiring line connected to a contact of the electromagnetic relay; a fourth operation detection unit including a fourth light-emitting unit to emit light when detecting that the change in conductive state of the second wiring line has disappeared; an imaging unit to capture a moving image of the first operation detection unit, the second operation detection unit, the third operation detection unit, and the fourth operation detection unit; and a diagnostic unit to calculate, by using the moving image, a contact-on operation time that is a time from when a current starts flowing through the first wiring line until when a conductive state of the second wiring line changes and a contact-off operation time that is a time from when a current stops flowing through the first wiring line until when the change in conductive state of the second wiring line disappears, and to diagnose whether or not an abnormality has occurred in the electromagnetic relay on the basis of the contact-on operation time and the contact-off operation time calculated.

Advantageous Effects of Invention

The present invention exerts an advantageous effect that a contact-on operation time and a contact-off operation time can be measured.

DESCRIPTION OF EMBODIMENTS

Hereinafter, an electromagnetic relay diagnostic device according to each embodiment of the present invention will be described in detail with reference to the drawings. The present invention is not limited to the embodiments.

First Embodiment

Figure 1:
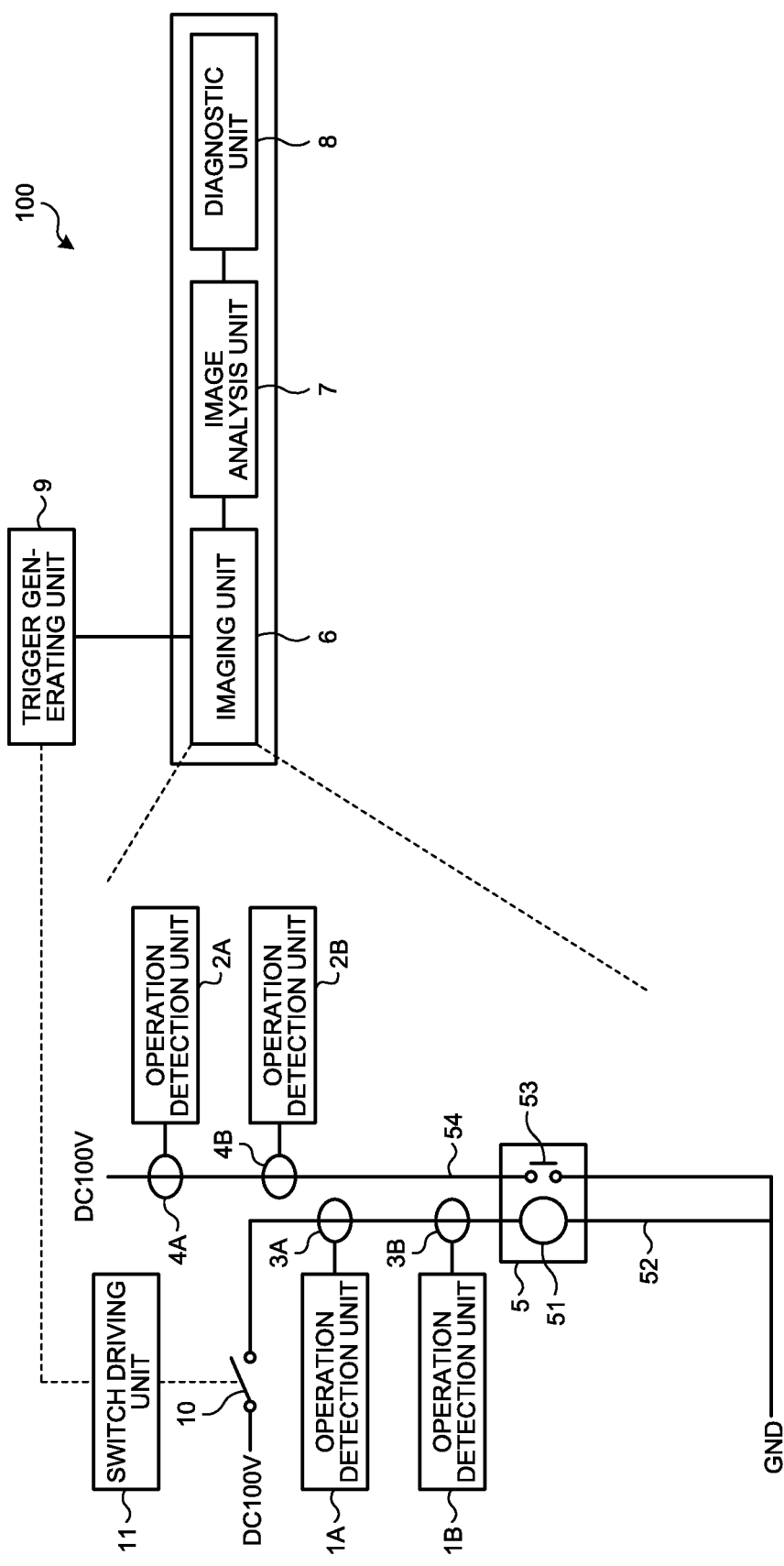
FIG. 1 is a diagram illustrating a configuration of an electromagnetic relay diagnostic device according to a first embodiment of the present invention.

FIG. 1 is a diagram illustrating a configuration of an electromagnetic relay diagnostic device according to a first embodiment of the present invention. When an operation start switch 10 is closed, an electric current flows through a coil 51 through a wiring line 52 that is a first wiring line, and thereby an electromagnetic relay 5 operates, the relay 5 being a diagnosed object of an electromagnetic relay diagnostic device 100 according to the first embodiment, and then the electromagnetic relay 5 closes a contact 53 to flow an electric current through a wiring line 54 that is a second wiring line. The electromagnetic relay diagnostic device 100 according to the first embodiment includes: Rogowski coils 3A and 3B which are electrically insulated from and attached to the wiring line 52 connected to the coil 51 of the electromagnetic relay 5; Rogowski coils 4A and 4B which are electrically insulated from and attached to the wiring line 54 connected to the contact 53 of the electromagnetic relay 5; operation detection units 1A, 1B, 2A, and 2B which detect the operation of the electromagnetic relay 5 on the basis of output voltages of the Rogowski coils 3A, 3B, 4A, and 4B; and an imaging unit 6 which captures moving images of the operation detection units 1A, 1B, 2A, and 2B. The electromagnetic relay diagnostic device 100 further includes an image analysis unit 7 which processes a moving image captured by the imaging unit 6, and a diagnostic unit 8 which diagnoses whether or not the electromagnetic relay 5 is abnormal on the basis of the moving image processed by the image analysis unit 7. The operation detection unit 1A is a first operation detection unit which detects that an electric current has started flowing through the wiring line 52. The operation detection unit 1B is a second operation detection unit which detects that an electric current has stopped flowing through the wiring line 52. The operation detection unit 2A is a third operation detection unit which detects that a conductive state of the wiring line 54 has changed. The operation detection unit 2B is a fourth operation detection unit which detects that the change in the conductive state of the wiring line 54 has disappeared. The Rogowski coil 3A is a first Rogowski coil for detecting that an electric current has started flowing through the wiring line 52. The Rogowski coil 3B is a second Rogowski coil for detecting that an electric current has stopped flowing through the wiring line 52. The Rogowski coil 4A is a third Rogowski coil for detecting that an electric current has started flowing through the wiring line 54. The Rogowski coil 4B is a fourth Rogowski coil for detecting that an electric current has stopped flowing through the wiring line 54.

In the first embodiment, what is meant by the change in the conductive state of the wiring line 54 is that a current begins to flow through the wiring line 54. What is meant by that the change in the conductive state of the wiring line 54 disappears is that a current flow through the wiring line 54 halts. In a case of the electromagnetic relay 5 in which when a current flows through the coil 51, the contact 53 opens and a current stops flowing through the wiring line 54, what is meant by the change in the conductive state of the wiring line 54 is that a current stops flowing through the wiring line 54, and what is meant by that the change in the conductive state of the wiring line 54 disappears is that a current begins to flow through the wiring line 54.

Figure 2:
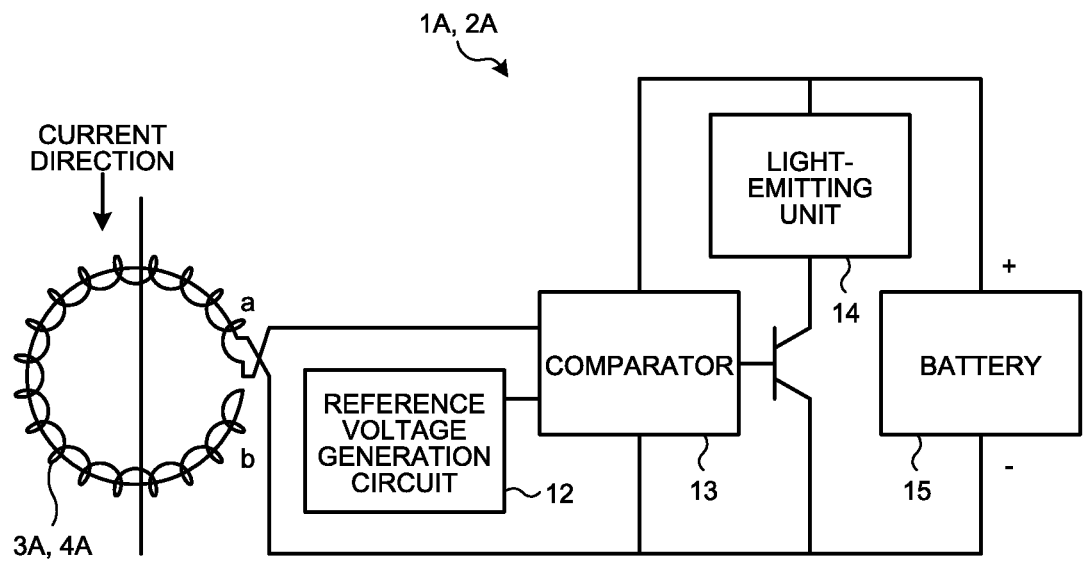
FIG. 2 is a diagram illustrating a configuration of an operation detection unit of the electromagnetic relay diagnostic device according to the first embodiment.
Figure 3:
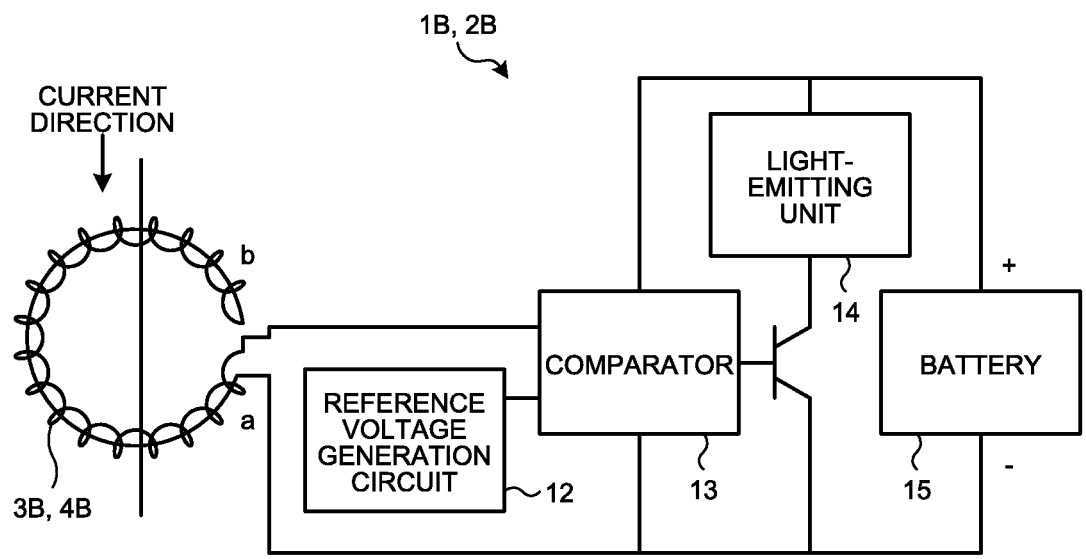
FIG. 3 is a diagram illustrating a configuration of an operation detection unit of the electromagnetic relay diagnostic device according to the first embodiment.

FIGS. 2 and 3 are diagrams each illustrating a configuration of the operation detection unit of the electromagnetic relay diagnostic device according to the first embodiment. FIG. 2 illustrates the configuration of the operation detection unit 1A that is the first operation detection unit and the operation detection unit 2A that is the third operation detection unit, and FIG. 3 illustrates the configuration of the operation detection unit 1B that is the second operation detection unit and the operation detection unit 2B that is the fourth operation detection unit. The operation detection units 1A, 1B, 2A, and 2B each include a reference voltage generation circuit 12 which generates a reference voltage, a comparator 13 which compares output voltages of the Rogowski coil 3A, 3B, 4A, or 4B with the reference voltage, a light-emitting unit 14 which lights up when the output voltage of the corresponding Rogowski coils 3A, 3B, 4A, or 4B reaches the reference voltage, and a battery 15 which supplies an electric power to the reference voltage generation circuit 12, the comparator 13, and the light-emitting unit 14. A connection state between the Rogowski coil 3A or 4A and the comparator 13 in the operation detection unit 1A as the first operation detection unit and the operation detection unit 2A as the third operation detection unit is opposite to a connection state between the Rogowski coil 3B or 4B and the comparator 13 in the operation detection unit 1B as the second operation detection unit and the operation detection unit 2B as the fourth operation detection unit. Light emitting diodes can be applied to the light-emitting units of the operation detection units 1A, 1B, 2A, and 2B, but are not intended to limit the embodiment. The light-emitting unit 14 of the operation detection unit 1A is a first light-emitting unit which emits light when a current flows through the wiring line 52. The light-emitting unit 14 of the operation detection unit 1B is a second light-emitting unit which emits light when a current stops flowing through the wiring line 52. The light-emitting unit 14 of the operation detection unit 2A is a third light-emitting unit which emits light when a current flows through the wiring line 54. The light-emitting unit 14 of the operation detection unit 2B is a fourth light-emitting unit which emits light when a current stops flowing through the wiring line 54.

Because the difference between the operation detection units 1A and 2A and the operation detection units 1B and 2B is only the connection state of each of the Rogowski coils 3A, 3B, 4A, and 4B to the comparator 13, determination of whether the operation detection unit is used to detect that a current has started flowing or that a current has stopped flowing can be easily changed.

The image analysis unit 7 processes a moving image captured by the imaging unit 6, and records a first frame number at a time when an image of a portion for the light-emitting unit 14 of the operation detection unit 1A changes in state from a state before the electromagnetic relay 5 operates and records a second frame number at a time when an image of a portion for the light-emitting unit 14 of the operation detection unit 2A changes in state. In addition, the image analysis unit 7 processes a moving image captured by the imaging unit 6, records a third frame number at a time when an image of a portion for the light-emitting unit 14 of the operation detection unit 1B changes in state from a state before the electromagnetic relay 5 operates and records a fourth frame number at a time when an image of a portion for the light-emitting unit 14 of the operation detection unit 2B changes in state.

The diagnostic unit 8 calculates a contact-on operation time, which is a time from when a current starts flowing through the wiring line 52 as the first wiring line until when a current starts flowing through the wiring line 54 as the second wiring line from a difference between the first frame number and the second frame number recorded by the image analysis unit 7 and a frame rate and compares the contact-on operation time with a management value for a contact-on operation time, and if the calculated contact-on operation time exceeds the management value, the diagnostic unit 8 diagnoses the electromagnetic relay 5 as abnormal. In addition, the diagnostic unit 8 calculates a contact-off operation time, which is a time from when a current stops flowing through the wiring line 52 as the first wiring line until when a current stops flowing through the wiring line 54 as the second wiring line from a difference between the third frame number and the fourth frame number recorded by the image analysis unit 7 and a frame rate and compares the contact-off operation time with a management value for a contact-off operation time, and if the calculated contact-off operation time exceeds the management value, the diagnostic unit 8 diagnoses the electromagnetic relay 5 as abnormal.

The electromagnetic relay diagnostic device 100 includes a trigger generating unit 9 which outputs a trigger signal when the imaging unit 6 starts imaging, and a switch driving unit 11 which closes the operation start switch 10 when receiving the trigger signal. The transmission and reception of the trigger signal between the trigger generating unit 9 and the switch driving unit 11 is performed by wireless communication.

The electromagnetic relay diagnostic device 100 according to the first embodiment can measure the contact-on operation time and the contact-off operation time of the electromagnetic relay 5 in a simpler manner to diagnose the presence or absence of an abnormality in the electromagnetic relay 5. In addition, as compared with an inspection manner in which each device to be controlled is operated at the time of periodic inspection and if the device operation is within a control range, each electromagnetic relay of a control circuit is also determined to be normal, the reliability of an inspection work is improved since the electromagnetic relay 5 itself is diagnosed.

Second Embodiment

Figure 4:
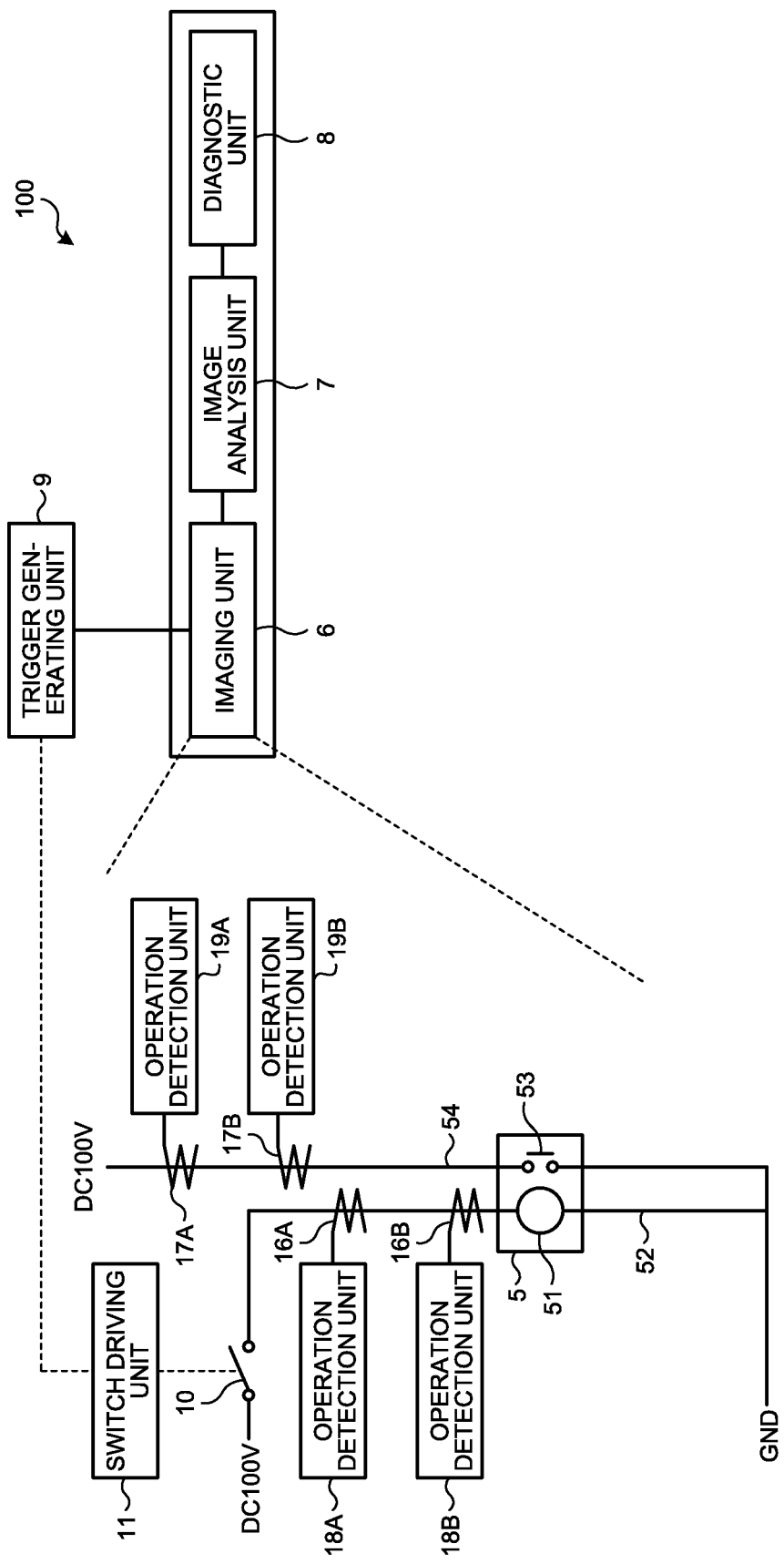
FIG. 4 is a diagram illustrating a configuration of an electromagnetic relay diagnostic device according to a second embodiment of the present invention.

FIG. 4 is a diagram illustrating a configuration of an electromagnetic relay diagnostic device according to a second embodiment of the present invention. The electromagnetic relay diagnostic device 100 according to the second embodiment includes split-core current transformers instead of the Rogowski coils. The electromagnetic relay diagnostic device 100 according to the second embodiment includes split-core current transformers 16A and 16B which are electrically insulated from and attached to the wiring line 52 connected to the coil 51 of the electromagnetic relay 5, split-core current transformers 17A and 17B which are electrically insulated from and attached to the wiring line 54 used to be connected to the contact 53 of the electromagnetic relay 5, and operation detection units 18A, 18B, 19A, and 19B which detect the operation of the electromagnetic relay 5 on the basis of output voltages of the split-core current transformers 16A, 16B, 17A, and 17B. The imaging unit 6, the image analysis unit 7, and the diagnostic unit 8 are similar to those in the first embodiment. The operation detection unit 18A is a first operation detection unit which detects that a current has started flowing through the wiring line 52. The operation detection unit 18B is a second operation detection unit which detects that a current has stopped flowing through the wiring line 52. The operation detection unit 19A is a third operation detection unit which detects that a conductive state of the wiring line 54 has changed. The operation detection unit 19B is a fourth operation detection unit which detects that the change in the conductive state of the wiring line 54 has disappeared. The split-core current transformer 16A is a first split-core current transformer configured to detect that a current has started flowing through the wiring line 52. The split-core current transformer 16B is a second split-core current transformer configured to detect that a current has stopped flowing through the wiring line 52. The split-core current transformer 17A is a third split-core current transformer configured to detect that a current has started flowing through the wiring line 54. The split-core current transformer 17B is a fourth split-core current transformer configured to detect that a current has stopped flowing through the wiring line 54.

In the second embodiment, what is meant by the change in the conductive state of the wiring line 54 is that a current starts flowing through the wiring line 54. What is meant by that the change in the conductive state of the wiring line 54 disappears is that a current stops flowing through the wiring line 54. In a case of the electromagnetic relay 5 in which the contact 53 opens and a current stops flowing through the wiring line 54 when a current flows through the coil 51, what is meant by the change in the conductive state of the wiring line 54 is that a current stops flowing through the wiring line 54, and what is meant by that the change in the conductive state of the wiring line 54 disappears is that a current starts flowing through the wiring line 54.

Figure 5:
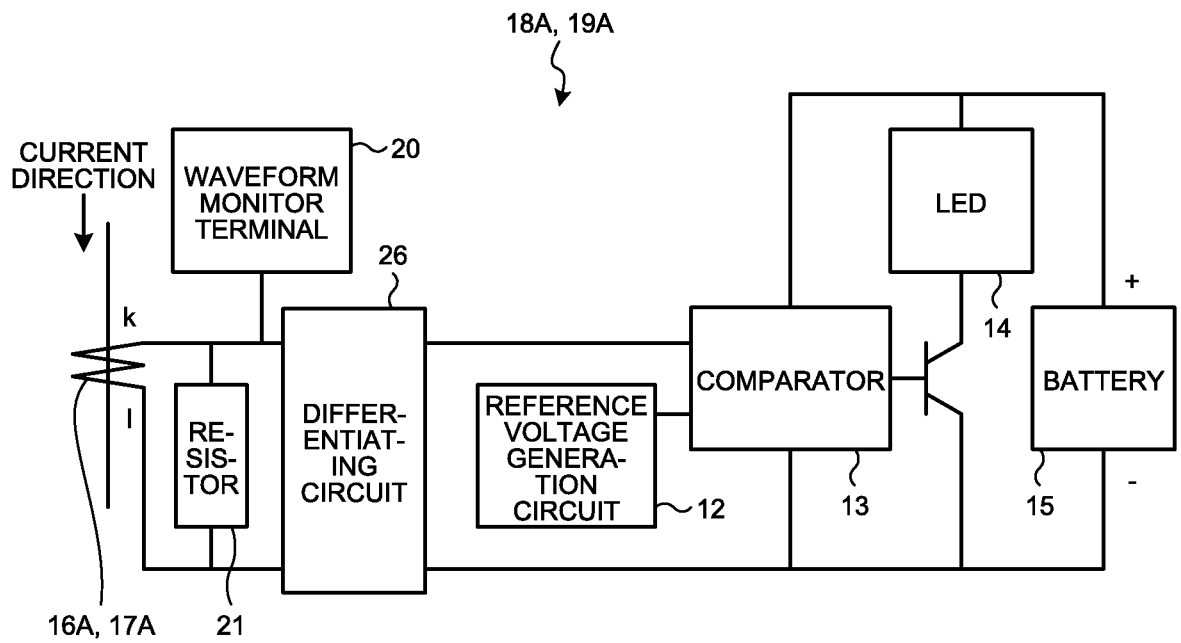
FIG. 5 is a diagram illustrating a configuration of an operation detection unit of the electromagnetic relay diagnostic device according to the second embodiment.
Figure 6:
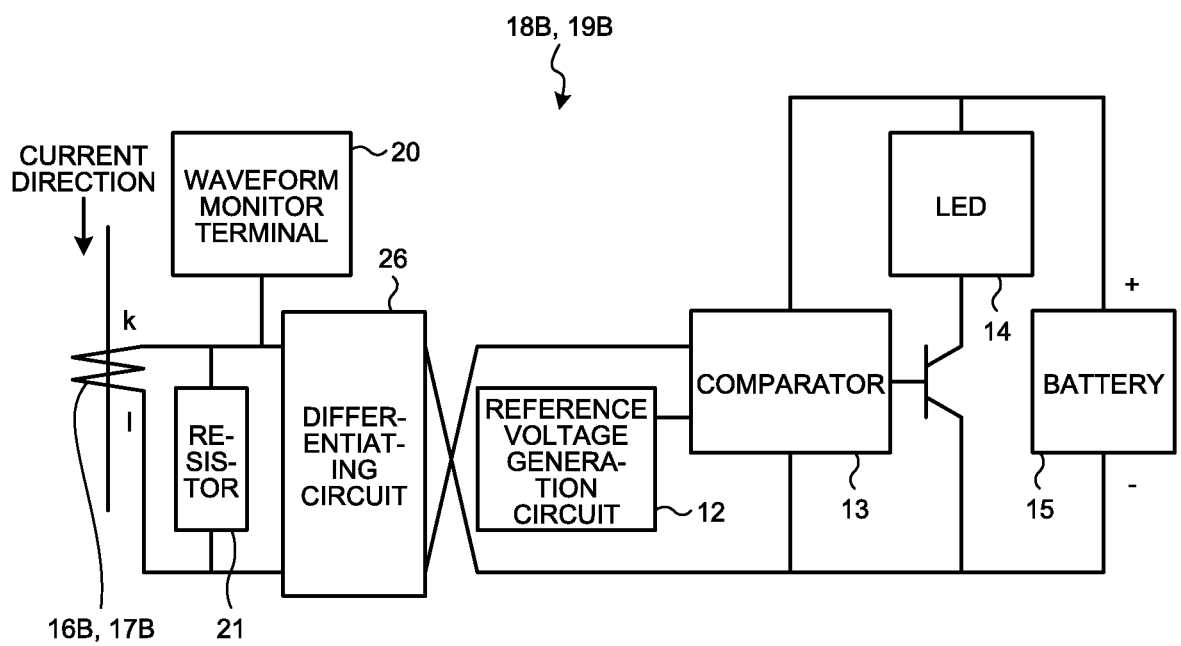
FIG. 6 is a diagram illustrating a configuration of an operation detection unit of the electromagnetic relay diagnostic device according to the second embodiment.

FIGS. 5 and 6 are diagrams each illustrating a configuration of an operation detection unit of the electromagnetic relay diagnostic device according to the second embodiment. FIG. 5 illustrates the configuration of the operation detection unit 18A that is a first operation detection unit and the operation detection unit 19A that is a third operation detection unit, and FIG. 6 illustrates the configuration of the operation detection unit 18B that is a second operation detection unit and the operation detection unit 19B that is a fourth operation detection unit. The operation detection units 18A, 18B, 19A, and 19B each include: the reference voltage generation circuit 12 which generates a reference voltage; a resistor 21 connected in parallel with the split-core current transformer 16A, 16B, 17A, or 17B to the comparator 13; a differentiating circuit 26; the comparator 13 which compares an output voltage of the split-core current transformer 16A, 16B, 17A, or 17B with the reference voltage; the light-emitting unit 14 which lights up when the output voltage of the corresponding split-core current transformer 16A, 16B, 17A, or 17B reaches the reference voltage; and the battery 15 which supplies an electric power to the reference voltage generation circuit 12, the comparator 13, and the light-emitting unit 14.

A connection state between the comparator 13 and the differentiating circuit 26 in the operation detection unit 18A as the first operation detection unit and the operation detection unit 19A as the third operation detection unit is opposite to a connection state between the comparator 13 and the differentiating circuit 26 in the operation detection unit 18B as the second operation detection unit and the operation detection unit 19B as the fourth operation detection unit. Light emitting diodes can be applied to the light-emitting units of the operation detection units 18A, 18B, 19A, and 19B, but the present invention is not limited to this example. The light-emitting unit 14 of the operation detection unit 18A is a first light-emitting unit which emits light when a current flows through the wiring line 52. The light-emitting unit 14 of the operation detection unit 18B is a second light-emitting unit which emits light when a current stops flowing through the wiring line 52. The light-emitting unit 14 of the operation detection unit 19A is a third light-emitting unit which emits light when a current flows through the wiring line 54. The light-emitting unit 14 of the operation detection unit 19B is a fourth light-emitting unit which emits light when a current stops flowing through the wiring line 54.

Because the difference between the operation detection units 18A and 19A and the operation detection units 18B and 19B is only the connection state of the differentiating circuit 26 to the comparator 13, determination of whether the operation detection unit should be used to detect that a current has started flowing or that a current has stopped flowing can be easily changed.

The operation detection units 18A, 18B, 19A, and 19B each include a waveform monitor terminal 20, so that waveforms of currents flowing through the wiring lines 52 and 54 can be checked when a waveform display device such as an oscilloscope is connected to the waveform monitor terminal 20.

Since the electromagnetic relay diagnostic device 100 according to the second embodiment includes the split-core current transformers 16A, 16B, 17A, and 17B, a current waveform flowing to a primary side is outputted to a secondary side depending on a current transformation ratio. Therefore, when a defect such as an impermissible operation delay of the electromagnetic relay 5 is found, it is possible to investigate the cause of the defect by checking whether or not there is any disturbance in a primary current waveform due to chattering of the operation start switch 10 with the use of the waveform monitor terminal 20 provided in each of the operation detection units 18A, 18B, 19A, and 19B.

Third Embodiment

Figure 7:
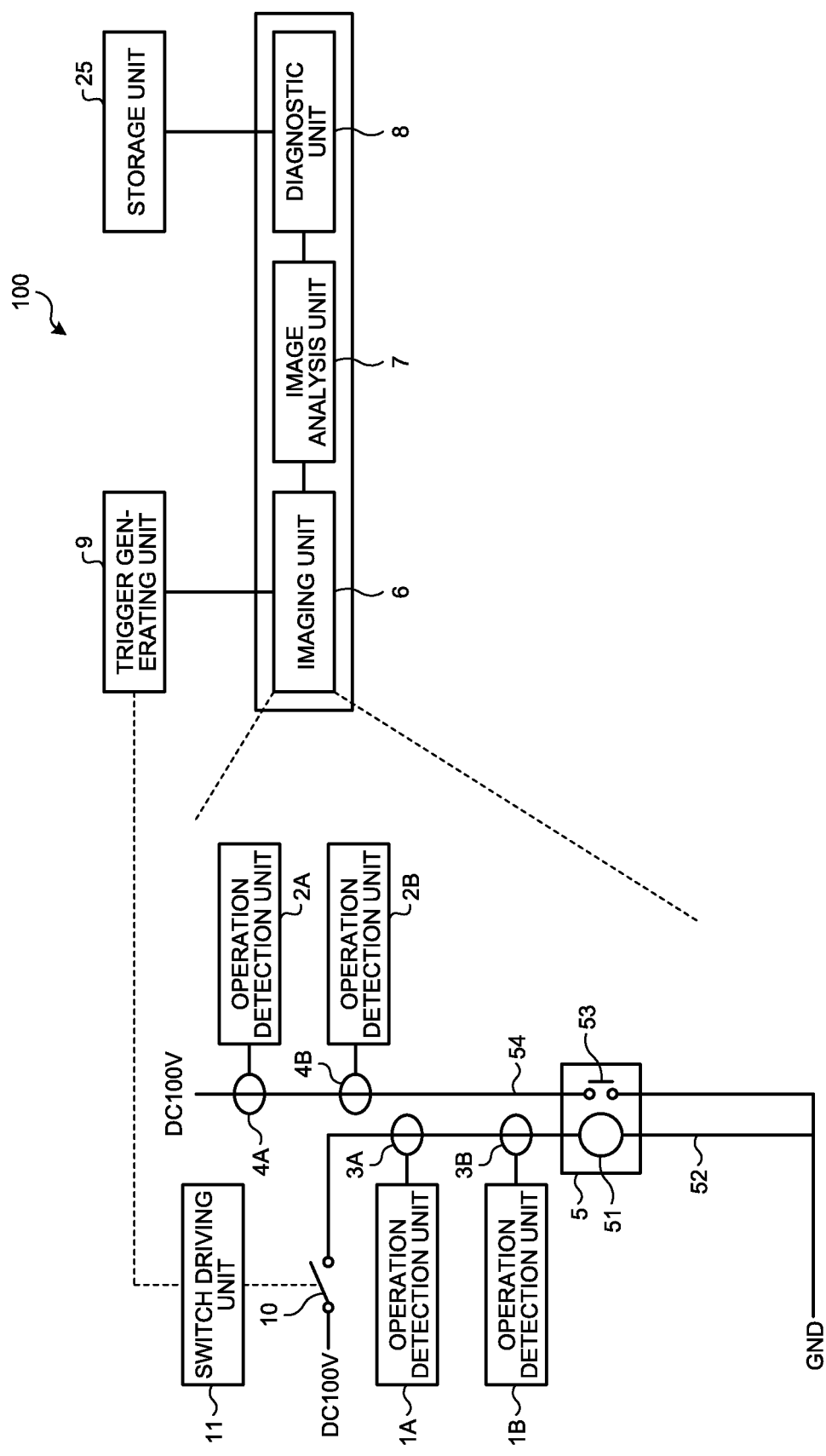
FIG. 7 is a diagram illustrating a configuration of an electromagnetic relay diagnostic device according to a third embodiment of the present invention.

FIG. 7 is a diagram illustrating a configuration of an electromagnetic relay diagnostic device according to a third embodiment of the present invention. The electromagnetic relay diagnostic device 100 according to the third embodiment is different from the first embodiment in that the electromagnetic relay diagnostic device 100 includes a storage unit 25 which stores data about the contact-on operation time and the contact-off operation time. The diagnostic unit 8 obtains the tendency of change with time in the operation time on the basis of an operation times at the time of installation and the time of previous measurement, and an operation time at the time of the currently performed measurement, in addition to in a method of making a diagnosis by comparing the contact-on operation time or the contact-off operation time with a corresponding management value therefor. For example, the diagnostic unit 8 obtains the amount of change in the operation time per unit time in the least square method, and diagnoses a situation as a sign of occurrence of an abnormality when the following is established: the amount of change in the operation time per unit time>the management value.

Figure 8:
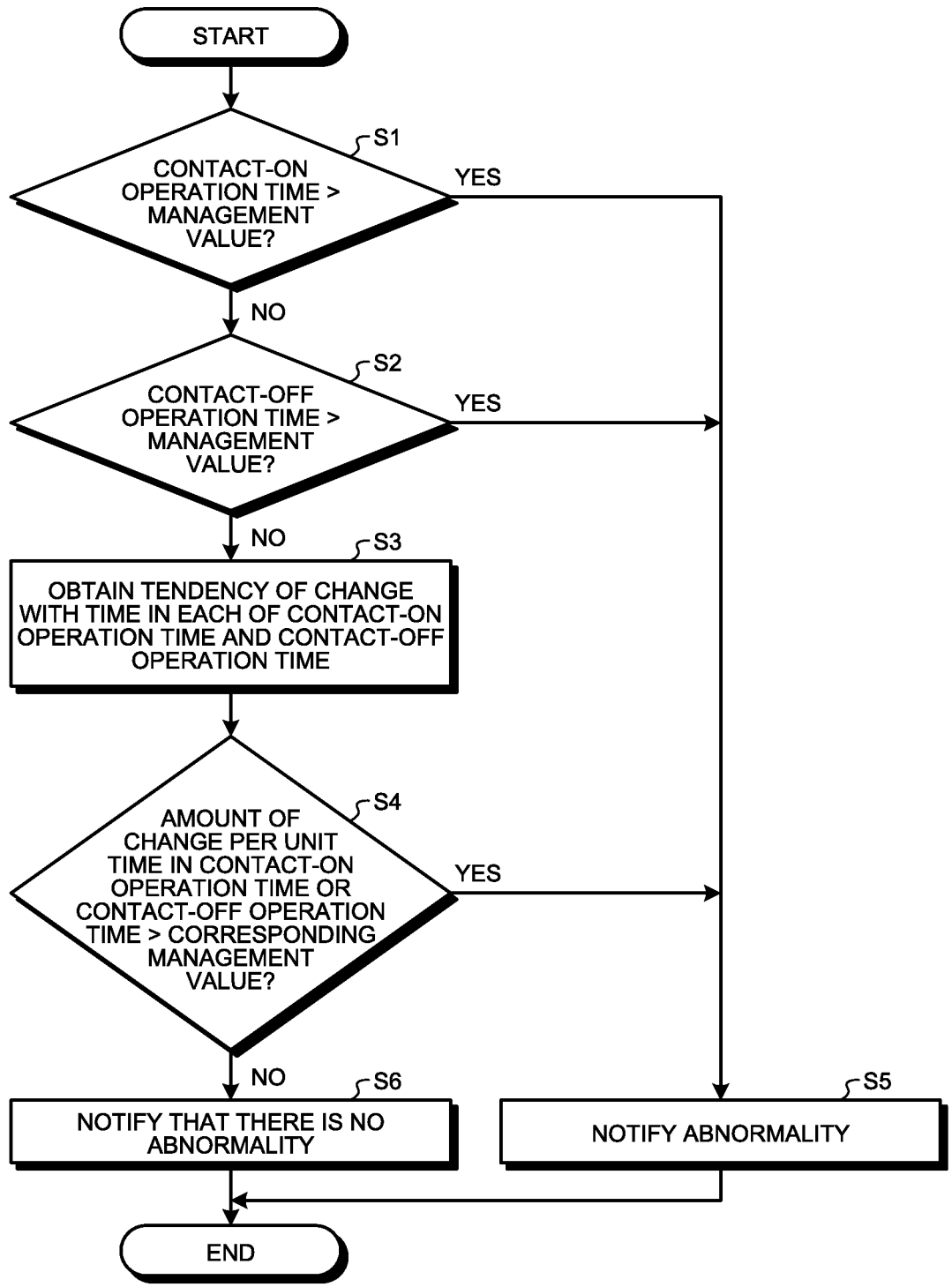
FIG. 8 is a flowchart illustrating a flow of an operation of the electromagnetic relay diagnostic device according to the third embodiment.

FIG. 8 is a flowchart illustrating a flow of an operation of the electromagnetic relay diagnostic device according to the third embodiment. In Step S1, the diagnostic unit 8 determines whether or not a contact-on operation time exceeds a management value. If the contact-on operation time exceeds the management value, the determination is Yes in Step S1, and the process proceeds to Step S5 and the diagnostic unit 8 performs an abnormality notification process. If the contact-on operation time is equal to or less than the management value, the determination is No in Step S1, and the process proceeds to Step S2. In Step S2, the diagnostic unit 8 determines whether a contact-off operation time exceeds a management value. If the contact-off operation time exceeds the management value, the determination is Yes in Step S2, and the process proceeds to Step S5 and the diagnostic unit 8 performs a process of notifying an abnormality. If the contact-off operation time is equal to or less than the management value, the determination is No in Step S2, and the process proceeds to Step S3.

In Step S3, the diagnostic unit 8 obtains the tendency of change with time in each of the contact-on operation time and the contact-off operation time from an operation time at the time of previous measurement, stored in the storage unit 25 and an operation time at the time of the currently obtained measurement. That is, in Step S3, the diagnostic unit 8 obtains the amount of change per unit time in each of the contact-on operation time and the contact-off operation time. In Step S4, the diagnostic unit 8 determines whether the amount of change per unit time in the contact-on operation time or the contact-off operation time exceeds the corresponding management value. If the amount of change per unit time in the contact-on operation time or the contact-off operation time exceeds the corresponding management value, the determination is Yes in Step S4, and the process proceeds to Step S5 and the diagnostic unit 8 performs a process of notifying an abnormality. If the amount of change per unit time in the contact-on operation time or the contact-off operation time is equal to or less than the corresponding management value, the determination is No in Step S4, and the process proceeds to Step S6 and the diagnostic unit 8 performs a process of notifying that there is no abnormality.

Note that the content of the notification may be made different between a case where the determination in Step S4 is Yes and the process proceeds to Step S5, and another case where the determination in Step S1 or Step S2 is Yes and the process proceeds to Step S5. More specifically, in the case where the determination in Step S4 is Yes and the process proceeds to Step S5, the contact-on operation time and the contact-off operation time are each equal to or less than the corresponding management value at the time of the determination, and thus a warning may be issued which indicates that the contact-on operation time or the contact-off operation time is expected to exceed the corresponding management value in the future.

The electromagnetic relay diagnostic device 100 according to the third embodiment can diagnose the situation as a sign of occurrence of an abnormality even when the operation time of the electromagnetic relay 5 is within a normal range. Therefore, in a case where a diagnosis result is obtained which indicates a sign of occurrence of an abnormality, a user can perform a detailed investigation before the occurrence of a defect or perform maintenance for avoiding the occurrence of the defect.

Fourth Embodiment

Figure 9:
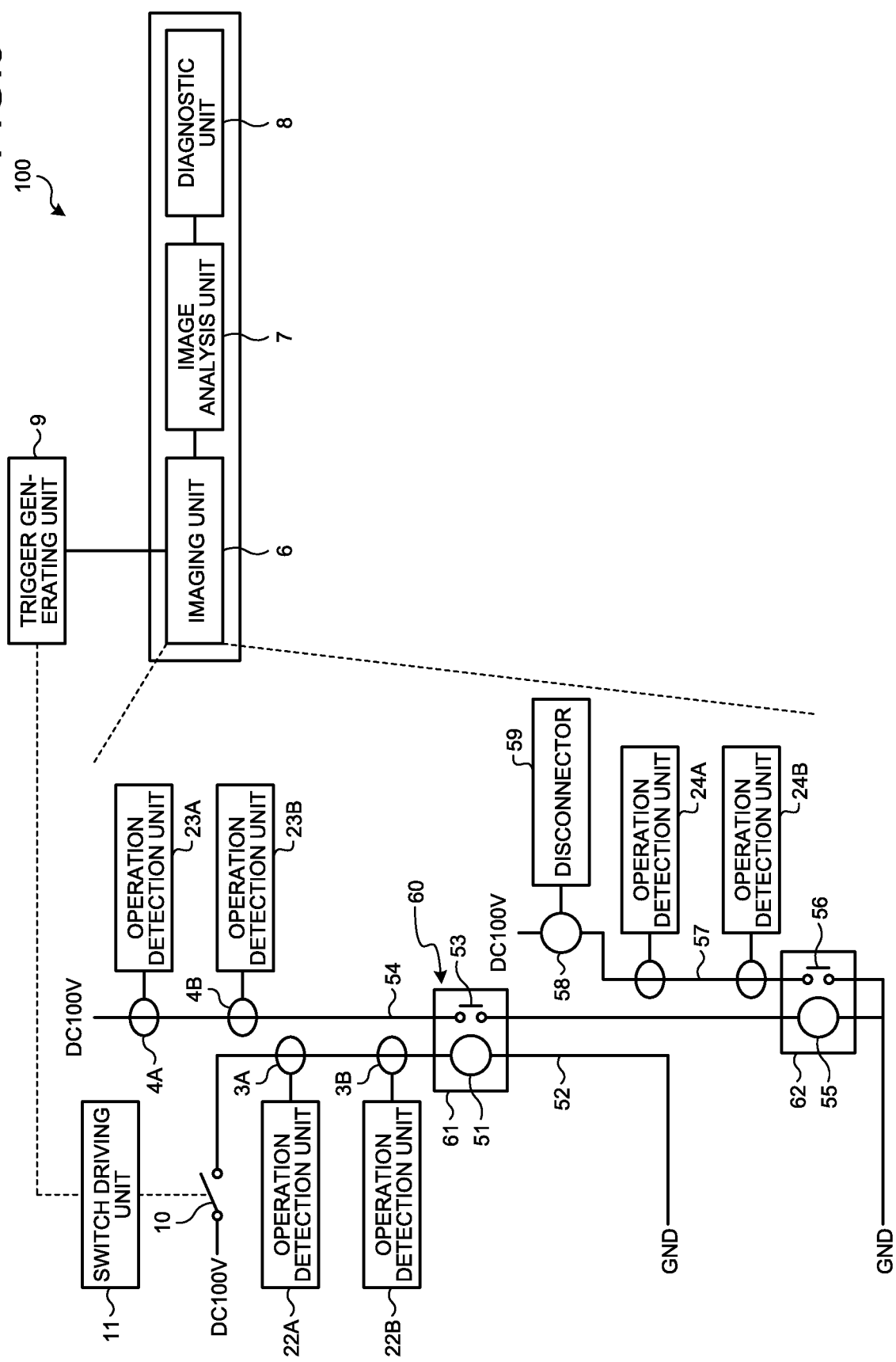
FIG. 9 is a diagram illustrating a configuration of an electromagnetic relay diagnostic device according to a fourth embodiment of the present invention.

FIG. 9 is a diagram illustrating a configuration of the electromagnetic relay diagnostic device according to a fourth embodiment of the present invention. The electromagnetic relay diagnostic device 100 according to the fourth embodiment has a control circuit 60 configured to perform control by combining two or more electromagnetic relays 61 and 62, all the electromagnetic relays 61 and 62 being provided with operation detection units 22A, 22B, 23A, 23B, 24A, and 24B. The diagnostic unit 8 diagnoses a contact-on operation time and a contact-off operation time of each of the electromagnetic relays 61 and 62, measures an operation order of each of the electromagnetic relays 61 and 62 and an operation time of a control sequence of the control circuit 60, and diagnoses the control circuit 60. In the fourth embodiment, the control circuit 60 has two control sequences. One of the control sequences of the control circuit 60 is a sequence in which when the operation start switch 10 is closed, a current flows through the coil 51 through the wiring line 52, thereby operating the electromagnetic relay 61, the contact 53 is closed and thus a current flows through the wiring line 54, a current flows through a coil 55, thereby operating the electromagnetic relay 62, the contact 56 is closed and thus a current flows through a wiring line 57, and a motor 58 operates and drives a disconnector 59. The other of the control sequences of the control circuit 60 is a sequence in which when the operation start switch 10 is opened, a current stops flowing to the coil 51 connected to the wiring line 52, and thereby the electromagnetic relay 61 returns, the contact 53 is opened and thus a current stops flowing to the wiring line 54, a current stops flowing to the coil 55 connected to the wiring line 54, and thereby the electromagnetic relay 62 returns, the contact 56 is opened and thus a current stops flowing to the wiring line 57, and the motor 58 stops and thus the disconnector 59 stops.

In a case where an object to be diagnosed is the electromagnetic relay 61 as a single unit, the operation detection unit 22A is a first operation detection unit configured to detect that a current has started flowing through the wiring line 52, the operation detection unit 22B is a second operation detection unit configured to detect that a current has stopped flowing through the wiring line 52, the operation detection unit 23A is a third operation detection unit configured to detect that a conductive state of the wiring line 54 has changed, and the operation detection unit 23B is a fourth operation detection unit configured to detect that the change in conductive state of the wiring line 54 has disappeared. On the other hand, in a case where an object to be diagnosed is the electromagnetic relay 62 as a single unit, the operation detection unit 23A is a first operation detection unit configured to detect that a current has started flowing through the wiring line 54, the operation detection unit 23B is a second operation detection unit configured to detect that a current has stopped flowing through the wiring line 54, the operation detection unit 24A is a third operation detection unit configured to detect that a conductive state of the wiring line 57 has changed, and the operation detection unit 24B is a fourth operation detection unit configured to detect that the change in conductive state of the wiring line 57 has disappeared.

In the fourth embodiment, what is meant by the change in conductive state of the wiring line 54 is that a current starts flowing through the wiring line 54. What is meant by that the change in conductive state of the wiring line 54 disappears is that a current stops flowing through the wiring line 54. In a case of the electromagnetic relay 61 in which the contact 53 opens and a current stops flowing through the wiring line 54 when a current flows through the coil 51, what is meant by the change in conductive state of the wiring line 54 is that a current stops flowing through the wiring line 54, and what is meant by that the change in conductive state of the wiring line 54 disappears is that a current starts flowing through the wiring line 54.

In the fourth embodiment, what is meant by the change in conductive state of the wiring line 57 is that a current starts flowing through the wiring line 57. What is meant by that the change in conductive state of the wiring line 57 disappears is that a current stops flowing through the wiring line 57. In a case of the electromagnetic relay 62 in which the contact 56 opens and a current stops flowing through the wiring line 57 when a current flows through the coil 55, what is meant by the change in conductive state of the wiring line 57 is that a current stops flowing through the wiring line 57, and what is meant by that the change in conductive state of the wiring line 57 disappears is that a current starts flowing through the wiring line 57.

Figure 10:
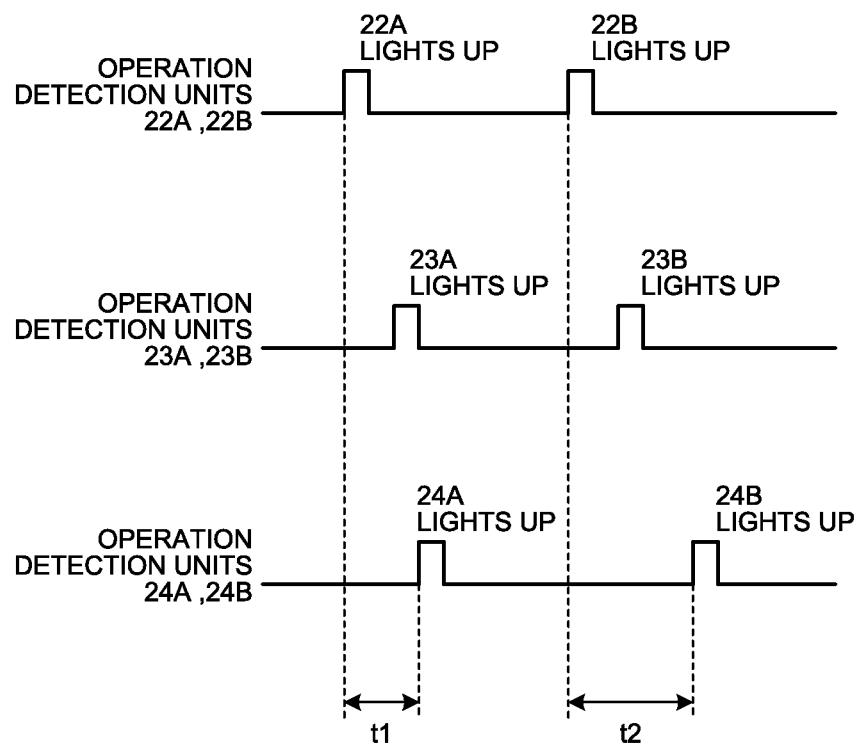
FIG. 10 is a chart illustrating an operation of the electromagnetic relay diagnostic device according to the fourth embodiment.

The electromagnetic relay diagnostic device 100 according to the fourth embodiment can measure, in a single measurement operation, an operation time of each of the electromagnetic relays 61 and 62 when being within a capturing range of the imaging unit 6, and can diagnose an operation time of each control sequence of the control circuit 60. FIG. 10 is a diagram illustrating an operation of the electromagnetic relay diagnostic device according to the fourth embodiment. The diagnostic unit 8 diagnoses the control circuit 60 on the basis of whether or not an operation time t1 of a control sequence from when the light-emitting unit 14 of the operation detection unit 22A lights up until when the light-emitting unit 14 of the operation detection unit 24A lights up, and an operation time t2 of a control sequence from when the light-emitting unit 14 of the operation detection unit 22B lights up until when the light-emitting unit 14 of the operation detection unit 24B lights up each exceed a management value thereof.

In a case where the operation time of any of the control sequences of the control circuit 60 is abnormal, even if the operation time of each of the electromagnetic relays 61 and 62 is within the normal range, it is possible to determine which of the electromagnetic relay 61 and the electromagnetic relay 62 has an operation time delay that affects the abnormality, and the operation time of each control sequence of the control circuit 60 can be kept within the normal range by replacing the electromagnetic relay 61 or 62 that has caused the abnormality.

The function of the diagnostic unit 8 according to the first to fourth embodiments is realized by a processing circuit. The processing circuit may be configured with dedicated hardware or an arithmetic device which executes a program stored in a storage device.

Figure 11:
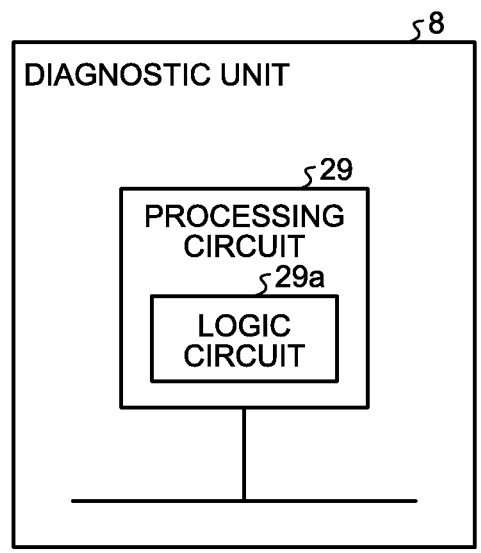
FIG. 11 is a diagram illustrating a configuration in which a function of a diagnostic unit according to the first to fourth embodiments is realized by hardware.

When the processing circuit is of dedicated hardware, the processing circuit corresponds to a single circuit, a composite circuit, a programmed processor, a parallel programmed processor, an application specific integrated circuit, a field programmable gate array, or any combination thereof. FIG. 11 is a diagram illustrating a configuration in which the function of the diagnostic unit according to the first to fourth embodiments is realized by hardware. A logic circuit 29a for realizing the function of the diagnostic unit 8 is incorporated in a processing circuit 29. As hardware which realizes the processing circuit 29, a microcontroller can be exemplified.

When the processing circuit 29 is an arithmetic device, the function of the diagnostic unit 8 is realized by software, firmware, or a combination of software and firmware.

Figure 12:
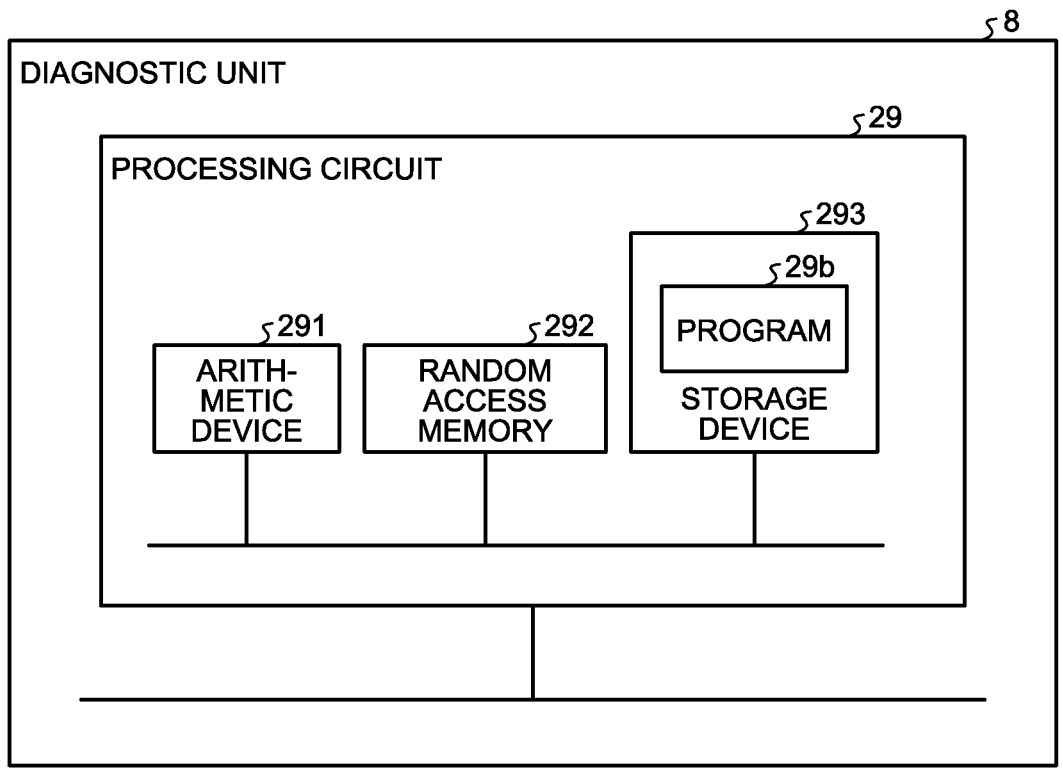
FIG. 12 is a diagram illustrating a configuration in which a function of a diagnostic unit according to the first to fourth embodiments is realized by software.

FIG. 12 is a diagram illustrating a configuration in which the function of the diagnostic unit according to the first to fourth embodiments is realized by software. The processing circuit 29 includes an arithmetic device 291 which executes a program 29b, a random access memory 292 used as a work area by the arithmetic device 291, and a storage device 293 which stores the program 29b. The function of the diagnostic unit 8 is realized by the arithmetic device 291 expanding the program 29b stored in the storage device 293 on the random access memory 292 and executing the program. The software or the firmware is described in a programming language and stored in the storage device 293. As the arithmetic device 291, a central processing unit can be exemplified but may not be used for the arithmetic device 291.

The processing circuit 29 realizes the function of the diagnostic unit 8 by reading and executing the program 29b stored in the storage device 293. It can also be said that the program 29b causes a computer to execute procedures and methods for realizing the function of the diagnostic unit 8.

A part of the processing circuit 29 may be realized by dedicated hardware and another part thereof may be realized by software or firmware.

Thus, the processing circuit 29 can realize each of the above-described functions by hardware, software, firmware, or any combination thereof.

The configurations described in the embodiments above are merely examples of the content of the present invention, and can be combined with other publicly known techniques and partially omitted and/or modified without departing from the gist of the present invention.

REFERENCE SIGNS LIST

1A, 1B, 2A, 2B, 18A, 18B, 19A, 19B, 22A, 22B, 23A, 23B, 24A, 24B operation detection unit; 3A, 3B, 4A, 4B Rogowski coil; 5, 61, 62 electromagnetic relay; 6 imaging unit; 7 image analysis unit; 8 diagnostic unit; 9 trigger generating unit; 10 operation start switch; 11 switch driving unit; 12 reference voltage generation circuit; 13 comparator; 14 light-emitting unit; 15 battery; 16A, 16B, 17A, 17B split-core current transformer; 20 waveform monitor terminal; 21 resistor; 25 storage unit; 26 differentiating circuit; 29 processing circuit; 29a logic circuit; 29b program; 51, 55 coil; 52, 54, 57 wiring line; 53, 56 contact; 58 motor; 59 disconnector; 60 control circuit; 100 electromagnetic relay diagnostic device; 291 arithmetic device; 292 random access memory; 293 storage device.

The invention claimed is:

1. An electromagnetic relay diagnostic device, comprising:
    a first operation detection unit including a first light-emitting unit to emit light when a current flows through a first wiring line connected to a coil of an electromagnetic relay;
    a second operation detection unit including a second light-emitting unit to emit light when a current stops flowing through the first wiring line;
    a third operation detection unit including a third light-emitting unit to emit light when detecting a change in conductive state of a second wiring line connected to a contact of the electromagnetic relay;
    a fourth operation detection unit including a fourth light-emitting unit to emit light when detecting that the change in conductive state of the second wiring line has disappeared;
    an imaging unit to capture a moving image of the first operation detection unit, the second operation detection unit, the third operation detection unit, and the fourth operation detection unit; and
    a diagnostic unit to calculate, by using the moving image, a contact-on operation time that is a time from when a current starts flowing through the first wiring line until when a conductive state of the second wiring line changes and a contact-off operation time that is a time from when a current stops flowing through the first wiring line until when the change in conductive state of the second wiring line disappears, and to diagnose whether or not an abnormality has occurred in the electromagnetic relay on the basis of the contact-on operation time and the contact-off operation time calculated.

2. The electromagnetic relay diagnostic device according to claim 1, wherein when at least one of the contact-on operation time and the contact-off operation time exceeds a management value therefor, the diagnostic unit diagnoses that an abnormality has occurred in the electromagnetic relay.

3. The electromagnetic relay diagnostic device according to claim 2, comprising:
    a storage unit to store measurement results of the contact-on operation time and the contact-off operation time, wherein
    the diagnostic unit obtains the amount of increase with time in each of the contact-on operation time and the contact-off operation time from the contact-on operation time and the contact-off operation time at the time of previous measurement, which are stored in the storage unit and the contact-on operation time and the contact-off operation time at the time of current measurement, and when at least one of the amount of increase with time in the contact-on operation time and the amount of increase with time in the contact-off operation time exceeds a management value therefor, the diagnostic unit diagnoses that an abnormality has occurred in the electromagnetic relay.

4. The electromagnetic relay diagnostic device according to claim 2, wherein when an operation time of a control sequence of a control circuit including two or more electromagnetic relays corresponding to the electromagnetic relay within an imaging range of the imaging unit exceeds a management value therefor, the diagnostic unit diagnoses that an abnormality has occurred in at least any one of the electromagnetic relays included in the control circuit.

5. The electromagnetic relay diagnostic device according to claim 1, wherein
    the diagnostic unit calculates the contact-on operation time from a difference between a frame number of the moving image at the time of light emission of the first light-emitting unit and a frame number of the moving image at the time of light emission of the third light-emitting unit, and a frame rate, and
    calculates the contact-off operation time from a difference between a frame number of the moving image at the time of light emission of the second light-emitting unit and a frame number of the moving image at the time of light emission of the fourth light-emitting unit, and a frame rate.

6. The electromagnetic relay diagnostic device according to claim 5, comprising:
a storage unit to store measurement results of the contact-on operation time and the contact-off operation time, wherein
the diagnostic unit obtains the amount of increase with time in each of the contact-on operation time and the contact-off operation time from the contact-on operation time and the contact-off operation time at the time of previous measurement, which are stored in the storage unit and the contact-on operation time and the contact-off operation time at the time of current measurement, and when at least one of the amount of increase with time in the contact-on operation time and the amount of increase with time in the contact-off operation time exceeds a management value therefor, the diagnostic unit diagnoses that an abnormality has occurred in the electromagnetic relay.

7. The electromagnetic relay diagnostic device according to claim 5, wherein when an operation time of a control sequence of a control circuit including two or more electromagnetic relays corresponding to the electromagnetic relay within an imaging range of the imaging unit exceeds a management value therefor, the diagnostic unit diagnoses that an abnormality has occurred in at least any one of the electromagnetic relays included in the control circuit.

8. The electromagnetic relay diagnostic device according to claim 1, wherein
the first operation detection unit includes a first Rogowski coil for detecting that a current has started flowing through the first wiring line,
the second operation detection unit includes a second Rogowski coil for detecting that a current has stopped flowing through the first wiring line,
the third operation detection unit includes a third Rogowski coil for detecting a change in conductive state of the second wiring line, and
the fourth operation detection unit includes a fourth Rogowski coil for detecting that the change in conductive state of the second wiring line has disappeared.

9. The electromagnetic relay diagnostic device according to claim 8, comprising:
a storage unit to store measurement results of the contact-on operation time and the contact-off operation time, wherein
the diagnostic unit obtains the amount of increase with time in each of the contact-on operation time and the contact-off operation time from the contact-on operation time and the contact-off operation time at the time of previous measurement, which are stored in the storage unit and the contact-on operation time and the contact-off operation time at the time of current measurement, and when at least one of the amount of increase with time in the contact-on operation time and the amount of increase with time in the contact-off operation time exceeds a management value therefor, the diagnostic unit diagnoses that an abnormality has occurred in the electromagnetic relay.

10. The electromagnetic relay diagnostic device according to claim 8, wherein when an operation time of a control sequence of a control circuit including two or more electromagnetic relays corresponding to the electromagnetic relay within an imaging range of the imaging unit exceeds a management value therefor, the diagnostic unit diagnoses that an abnormality has occurred in at least any one of the electromagnetic relays included in the control circuit.

11. The electromagnetic relay diagnostic device according to claim 1, wherein
the first operation detection unit includes a first split-core current transformer to detect that a current has started flowing through the first wiring line,
the second operation detection unit includes a second split-core current transformer to detect that a current has stopped flowing through the first wiring line,
the third operation detection unit includes a third split-core current transformer to detect a change in conductive state of the second wiring line, and
the fourth operation detection unit includes a fourth split-core current transformer to detect that the change in conductive state of the second wiring line has disappeared.

12. The electromagnetic relay diagnostic device according to claim 11, comprising:
a storage unit to store measurement results of the contact-on operation time and the contact-off operation time, wherein
the diagnostic unit obtains the amount of increase with time in each of the contact-on operation time and the contact-off operation time from the contact-on operation time and the contact-off operation time at the time of previous measurement, which are stored in the storage unit and the contact-on operation time and the contact-off operation time at the time of current measurement, and when at least one of the amount of increase with time in the contact-on operation time and the amount of increase with time in the contact-off operation time exceeds a management value therefor, the diagnostic unit diagnoses that an abnormality has occurred in the electromagnetic relay.

13. The electromagnetic relay diagnostic device according to claim 11, wherein when an operation time of a control sequence of a control circuit including two or more electromagnetic relays corresponding to the electromagnetic relay within an imaging range of the imaging unit exceeds a management value therefor, the diagnostic unit diagnoses that an abnormality has occurred in at least any one of the electromagnetic relays included in the control circuit.

14. The electromagnetic relay diagnostic device according to claim 1, comprising:
a storage unit to store measurement results of the contact-on operation time and the contact-off operation time, wherein
the diagnostic unit obtains the amount of increase with time in each of the contact-on operation time and the contact-off operation time from the contact-on operation time and the contact-off operation time at the time of previous measurement, which are stored in the storage unit and the contact-on operation time and the contact-off operation time at the time of current measurement, and when at least one of the amount of increase with time in the contact-on operation time and the amount of increase with time in the contact-off operation time exceeds a management value therefor, the diagnostic unit diagnoses that an abnormality has occurred in the electromagnetic relay.

15. The electromagnetic relay diagnostic device according to claim 1, wherein when an operation time of a control sequence of a control circuit including two or more electromagnetic relays corresponding to the electromagnetic relay within an imaging range of the imaging unit exceeds a management value therefor, the diagnostic unit diagnoses that an abnormality has occurred in at least any one of the electromagnetic relays included in the control circuit.

\* \* \* \* \*